United States Patent
Shin et al.

(10) Patent No.: US 10,529,782 B2
(45) Date of Patent: Jan. 7, 2020

(54) ORGANIC LIGHT EMITTING DISPLAY DEVICE INCLUDING MOISTURE-TRANSMISSION DELAY LAYER WHICH COVERS EDGES OF LINES

(71) Applicant: LG Display Co., Ltd., Seoul (KR)

(72) Inventors: Sangil Shin, Goyang-si (KR); Kiyoung Sung, Seoul (KR); Youngju Park, Seoul (KR); Sanghyun Lim, Goyang-si (KR); SangHoon Jeong, Iksan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/706,508

(22) Filed: Sep. 15, 2017

(65) Prior Publication Data
US 2018/0090547 A1    Mar. 29, 2018

(30) Foreign Application Priority Data
Sep. 29, 2016    (KR) .................. 10-2016-0125623

(51) Int. Cl.
*H01L 27/32* (2006.01)
*H01L 51/00* (2006.01)
*G09G 3/3208* (2016.01)
*H01L 51/52* (2006.01)

(52) U.S. Cl.
CPC ........ *H01L 27/3211* (2013.01); *G09G 3/3208* (2013.01); *H01L 27/3276* (2013.01); *H01L 51/0097* (2013.01); *H01L 51/5253* (2013.01); *H01L 51/5246* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2008/0309650 A1 | 12/2008 | Nishikawa et al. | |
| 2011/0006972 A1* | 1/2011 | Tanaka | H01L 27/3276 345/76 |
| 2012/0146886 A1* | 6/2012 | Minami | H01L 27/3276 345/80 |
| 2014/0138637 A1* | 5/2014 | Yang | H01L 27/1218 257/40 |

(Continued)

FOREIGN PATENT DOCUMENTS

| | | |
|---|---|---|
| EP | 1796171 A2 | 6/2007 |
| JP | 2007-156058 A * | 6/2007 |

OTHER PUBLICATIONS

Machine language translation of JP 2007-156058.*
European Extended Search Report, European Application No. 17193372.4, dated Feb. 15, 2018, 10 pages.

*Primary Examiner* — Erik Kielin
(74) *Attorney, Agent, or Firm* — Fenwick & West LLP

(57) ABSTRACT

In an embodiment, an organic light emitting display device includes a first substrate, a display region, a pad portion, lines, and a moisture-transmission delay layer. The display region includes sub-pixels disposed on the first substrate. The pad portion is disposed on the first substrate and electrically connected to an external device. The lines are disposed between the pad portion and the display region and electrically connected to the external device, and transfer a signal or power to the external device. The moisture-transmission delay layer covers edges of the lines.

19 Claims, 13 Drawing Sheets

(56) References Cited

U.S. PATENT DOCUMENTS

2015/0268775 A1  9/2015  Yu et al.
2016/0035812 A1* 2/2016  Kwon ................ H01L 27/3276
                                           257/40
2016/0141548 A1* 5/2016  Tanaka ............... H01L 51/5246
                                           257/40

* cited by examiner

170

ORGANIC LIGHT EMITTING DISPLAY DEVICE INCLUDING MOISTURE-TRANSMISSION DELAY LAYER WHICH COVERS EDGES OF LINES

CROSS-REFERENCE TO RELATED APPLICATION

This application claims priority under 35 U.S.C. § 119(a) of Republic of Korea Patent Application No. 10-2016-0125623, filed on Sep. 29, 2016, which is incorporated herein by reference in its entirety.

BACKGROUND

Technical Field

The present disclosure relates to an organic light emitting display device.

Discussion of the Related Art

An Organic Light Emitting Diode (OLED) used in an organic light emitting display device is a self-emitting element having an emission layer between two electrodes. The OLED emits light in a manner that an electron and a hole are injected from an electron cathode and a hole anode, respectively, so as to generate exciton, which is an electron-hole pair, and an excited state of the exciton falls to a ground state so as to emit light.

The organic light emission display device forms a display panel using the OLED. The display panel may be implemented as a top emission type, a bottom-emission type, or a dual-emission type depending on a direction of light emission. In addition, the display panel may be implemented as a passive matrix type or an active matrix type depending on a driving method. The organic light emitting display device may be formed to be flexible and thus implemented in various forms in which, for example, the display device has a curved surface or is artificially or mechanically bent.

The organic light emitting display device may be manufactured based on a flexible display panel and thus may be implemented in various forms in which, for example, the display device is artificially bent or have a curved surface.

The organic light emitting display device has the aforementioned characteristics and thus can be applied in various fields. However, due to structural characteristics, an existing organic light emitting display device has problems such as reduction in lifespan or image quality degradation, for example, a dark spot, which may occur because a display region of the display device is exposed to moisture. Therefore, there is need for a solution for these problems.

SUMMARY

Embodiments of the present invention provide an organic light emitting display device including a first substrate, a display region, a pad portion, a plurality of lines, and a moisture-transmission delay layer. The display region includes sub-pixels disposed on the first substrate. The pad portion is disposed on the first substrate and electrically connected to an external device. The plurality of lines are disposed between the pad portion and the display region. Further, the plurality of lines are electrically connected to the external device via the pad portion, and configured to transfer a signal or power to the external device. The moisture-transmission delay layer covers edges of the plurality of lines.

BRIEF DESCRIPTION OF THE DRAWINGS

The accompany drawings, which are included to provide a further understanding of embodiments of the invention and are incorporated on and constitute a part of this specification illustrate embodiments of the invention and together with the description serve to explain the principles of embodiments of the invention.

DETAILED DESCRIPTION

Reference will now be made in detail to embodiments of the invention, examples of which are illustrated in the accompanying drawings.

Hereinafter, embodiments of the present invention will be described with reference to the accompanying drawings.

In the following description, a Thin Film Transistor (TFT) may be referred to as a source electrode and a drain electrode, or a drain electrode and a source electrode, except for a gate electrode, depending on a type of the TFT. To avoid any limitation, the TFT may be described as including a first electrode and a second electrode.

Figure 1:
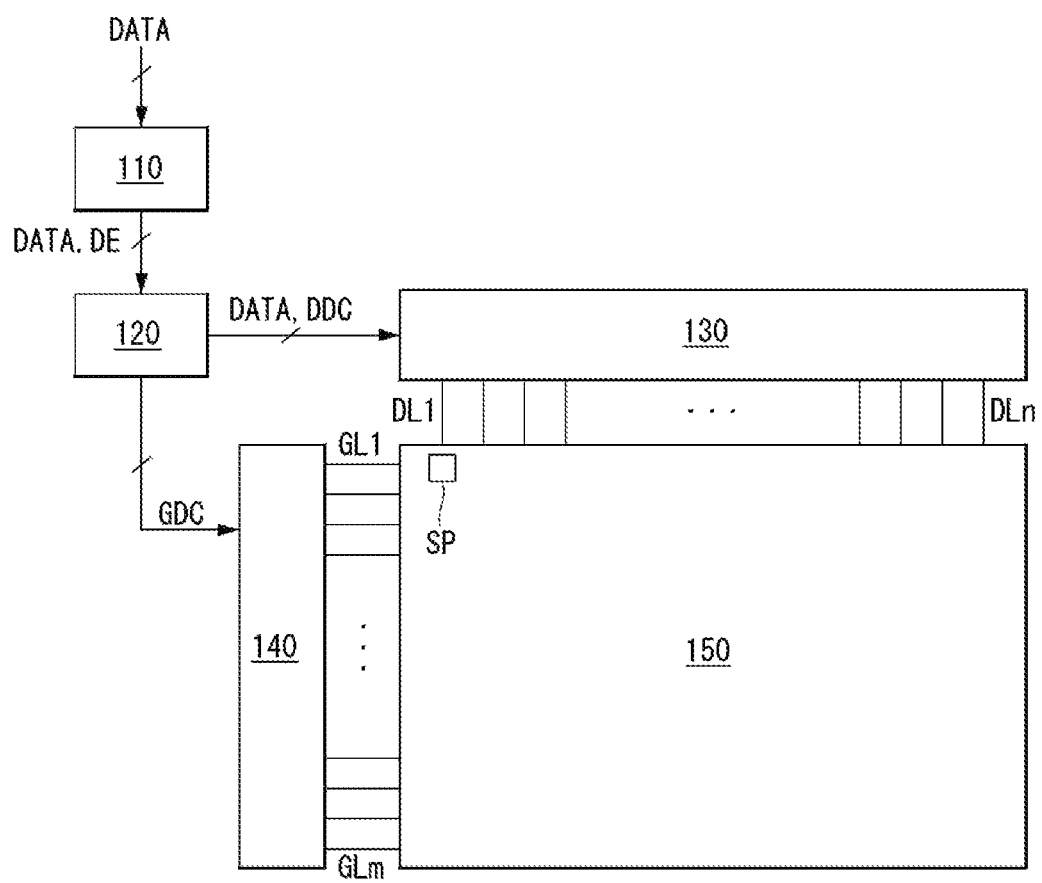
FIG. 1 is a block diagram illustrating an organic light emitting display device according to an embodiment.
Figure 2:
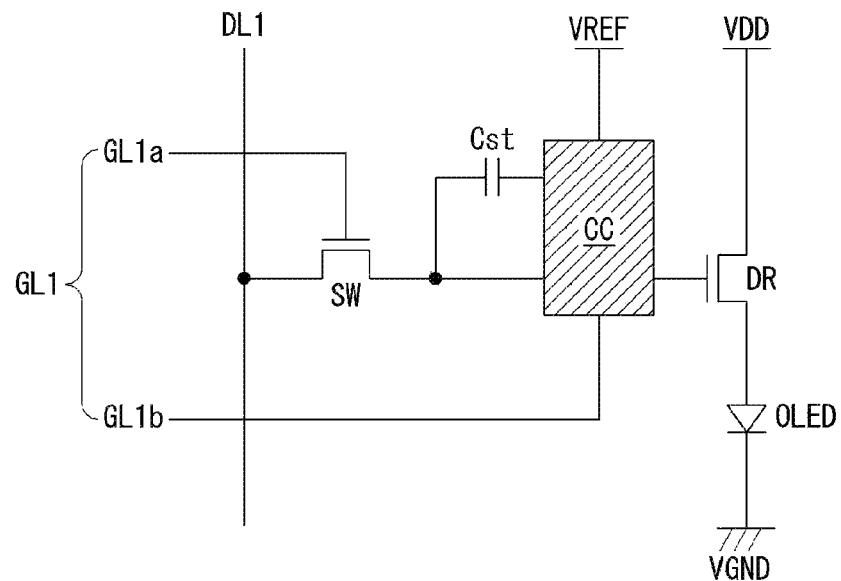
FIG. 2 is a circuit diagram of a sub-pixel according to an embodiment.
Figure 3:
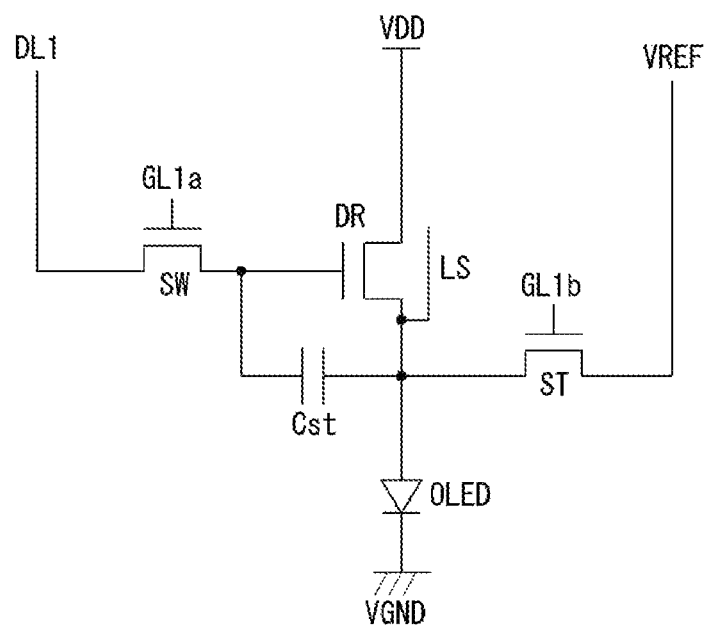
FIG. 3 is another circuit diagram of a sub-pixel according to an embodiment.

FIG. 1 is a block diagram illustrating an organic light emitting display device according to an embodiment, FIG. 2 is a circuit diagram of a sub-pixel according to an embodiment, and FIG. 3 is another circuit diagram of a sub-pixel according to an embodiment.

As illustrated in FIG. 1, an organic light emitting display device includes an image processor 110, a timing controller 120, a data driver 130, a gate driver 140, and a display panel 150.

The image processor 110 outputs a data enable signal DE in addition to a data signal DATA supplied from the outside. The image processor 110 may output at least one of a vertical synchronization signal, a horizontal synchronization signal, and a clock signal, apart from the data enable signal DE, but these signals are not depicted for convenience of explanation. The image processor 110 is in the form of an Integrated Circuit (IC) on a system circuit board.

The image processor 110 may supply the timing controller 120 with the data signal DATA, the data enable signal DE, or a driving signal that includes a vertical synchronization signal, a horizontal synchronization signal, and/or a clock signal.

Based on a driving signal, the timing controller 120 outputs a gate timing control signal GDC for controlling an operation timing of a gate driver 140, and outputs a data timing control signal DDC for controlling an operation timing of the data driver 130. The timing controller 120 is in the form of an IC on a control circuit board.

In response to a data timing control signal DDC supplied from the timing controller 120, the data driver 130 samples and latches a data signal DATA supplied from the timing controller 120, converts the sampled and latched data signal DATA into a gamma reference voltage, and outputs the gamma reference voltage. The data driver 130 outputs a data signal DATA via data lines DL1 to DLn. The data driver 130 is in the form of an IC attached to a data circuit board.

In response to a gate timing control signal GDC supplied from the timing controller 120, the gate driver 140 outputs a gate signal. The gate driver 140 outputs a gate signal via gate lines GL1 to GLm. The gate driver 140 is in the form of an IC on a gate circuit board or in the form of a Gate In Panel (GIP) circuit on the display panel 150.

The display panel 150 displays an image in response to a data signal DATA from the data driver 130 and a gate signal from the gate driver 140. The display panel 150 includes sub-pixels SP for displaying an image.

A sub-pixel may be implemented as a top-emission type, a bottom-emission type, or a dual-emission type depending on a structure. The sub-pixels SP may include a red sub-pixel, a green sub-pixel, and a blue sub-pixel, or may include a white sub-pixel, a red sub-pixel, a green sub-pixel, and a blue sub-pixel. The sub-pixels may have one or more emission areas depending on emission characteristics.

As illustrated in FIG. 2, a sub-pixel includes a switching transistor SW, a driving transistor DR, a capacitor Cst, a compensation circuit CC, and an OLED. The OLED operates to emit light by a driving current from the driving transistor DR.

In response to a gate signal supplied via a first gate line GL1, the switching transistor SW performs a switching operation such that a data signal supplied via a first data line DL1 is stored in capacitor Cst as a data voltage. With the data voltage stored in the capacitor Cst, the driving transistor DR operates to allow a driving current to flow between a high-potential power line VDD and a low-potential power line VGND.

The compensation circuit CC is a circuit for compensating for a threshold voltage of the driving transistor DR. In an embodiment, the compensation circuit is composed of one or more Thin Film Transistors (TFTs) and a capacitor. Configuration of the compensation circuit CC varies depending on a compensation method, and one example thereof will be described as follows.

As illustrated in FIG. 3, the compensation circuit CC includes a sensing transistor ST and a reference line VREF. The sensing transistor ST is connected between a source line of the driving transistor DR and an anode electrode of the OLED (hereinafter, referred to as a sensing node). The sensing transistor ST may operate to supply an initialization voltage (or a sensing voltage) transferred along the reference line VREF to the sensing node or to sense a voltage or current of the sensing node.

The switching transistor SW includes a gate electrode connected to a first gate line-a (GL1a), a first electrode connected to a first data line DL1, and a second electrode connected to a gate electrode of the driving transistor DR. The driving transistor DR includes the gate electrode connected to the second electrode of the switching transistor SW, a first electrode connected to a first power line VDD, and a second electrode connected to the anode electrode of the OLED. The capacitor Cst includes a first electrode connected to the gate electrode of the driving transistor DR, and a second electrode connected to the anode electrode of the OLED. The OLED includes an anode electrode connected to the second electrode of the driving transistor DR, and a cathode electrode of a second power line VGND. The sensing transistor ST includes a gate electrode connected to a first gate line-b (GL1b), a first electrode connected to the reference line VREF, and a second electrode connected to the second electrode of the driving transistor DR and the anode electrode of the OLED, which are the sensing node.

In an embodiment, the operation time of the sensing transistor ST may be similar or identical to an operation time of the switching transistor SW depending on a compensation algorithm (or configuration of the compensation circuit). The reference line VREF may be connected to the data driver 130. In this case, the data driver 130 may sense a sensing node of a sub-pixel during a non-display period or duration of an N-th frame (where N is an integer equal to or greater than 1), and may generate a sensing result.

A subject of compensation dependent upon a sensing result may be a digital or analog data signal or gamma. The compensation circuit for generating a compensation signal (or a compensation voltage) based on a sensing result may be implemented inside of the data driver 130, may be implemented inside of the timing controller, or may be implemented as an additional circuit.

In some embodiments, a light shield layer LS may be arranged only below a channel region of the driving transistor DR, or may be implemented not just below the channel region of the driving transistor DR but also below channel regions of the switching transistors SW and the sensing transistor ST. The light shield layer LS may be used only to shield external light in some embodiments, or may be used as an electrode for connection to a different electrode or line and/or for forming a capacitor.

FIG. 3 shows a sub-pixel in 3T(Transistor) 1C(Capacitor) structure which includes a switching transistor SW, a driving transistor DR, a capacitor Cst, an OLED, and a sensing transistor. However, if a compensation circuit CC is added, a sub-pixel may be in a 3T2C, 4T2C, 5T1C, or 6T2C structure (e.g., having a different number of transistors or capacitors).

In addition, TFTs such as the switching transistor SW, the driving transistor DR, and the sensing transistor ST may be implemented based on an LTPS, a-Si, oxide, or organic semiconductor layer.

Figure 4:
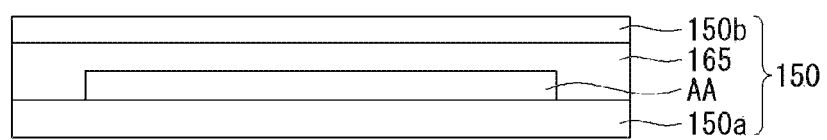
FIG. 4 is a cross-sectional view of a display panel according to an embodiment.
Figure 5:
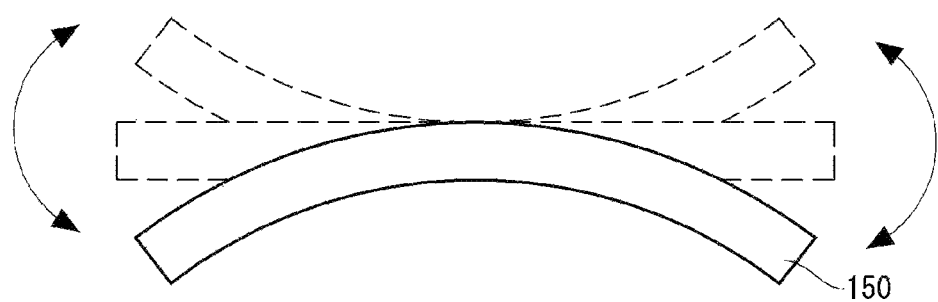
FIG. 5 illustrates mechanical characteristics of the display panel shown in FIG. 4 according to an embodiment.
Figure 6:
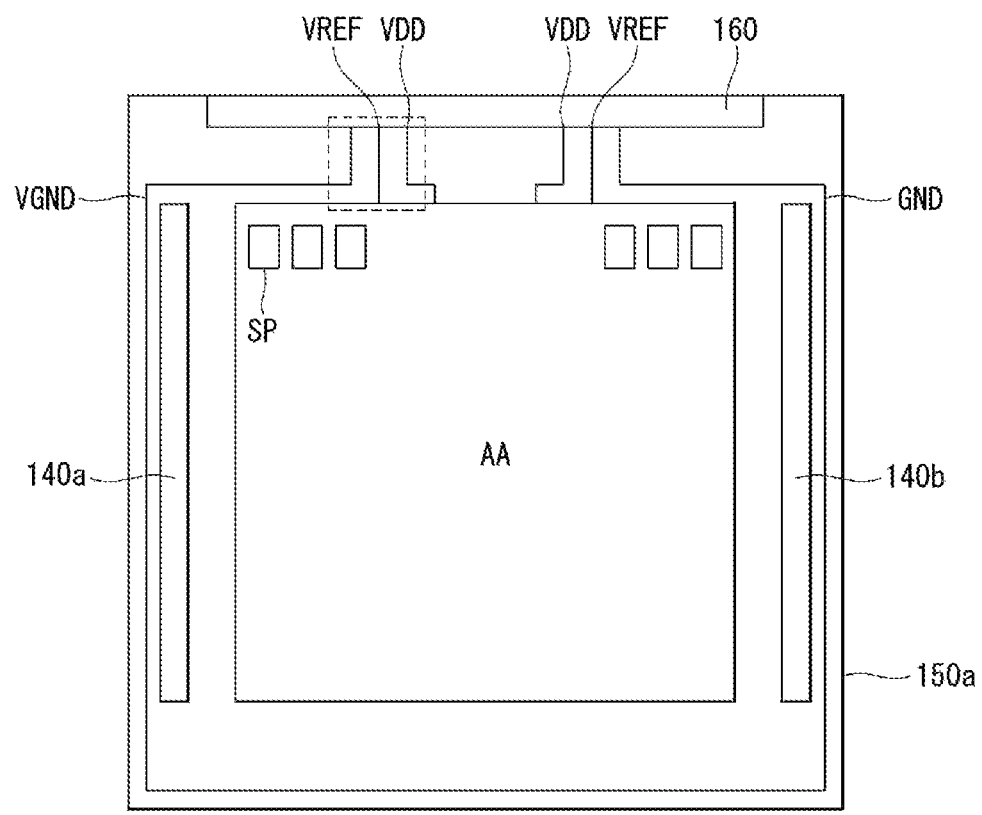
FIG. 6 is a plane view of a display panel according to an embodiment.
Figure 7:
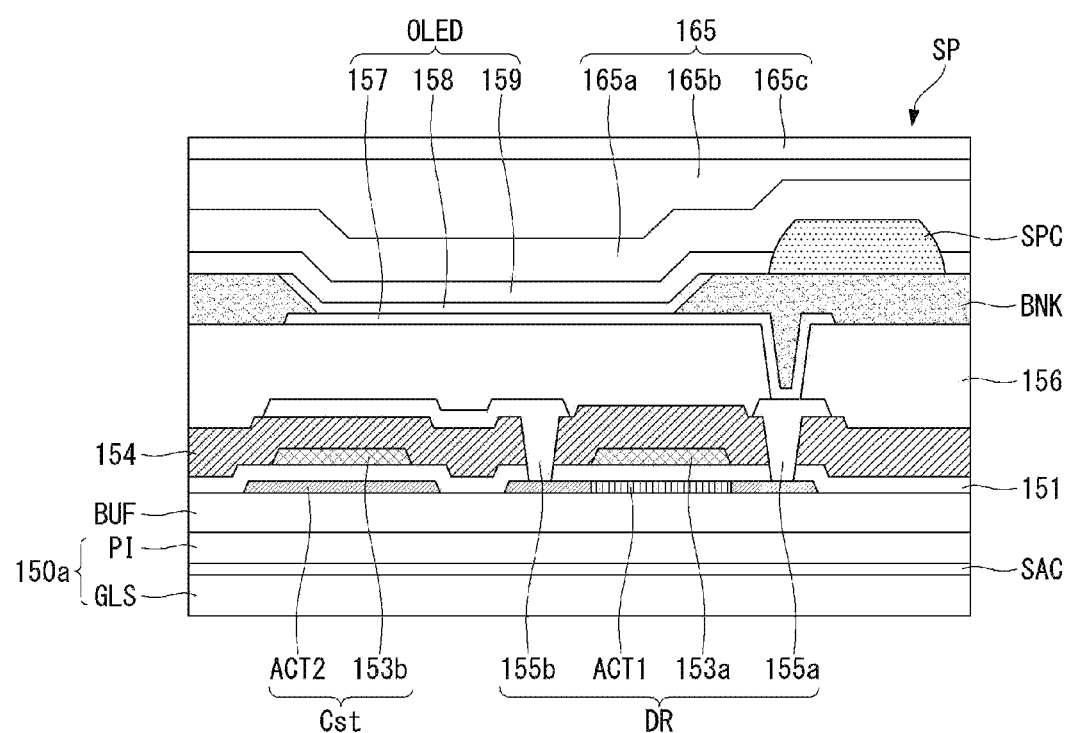
FIG. 7 is a cross-sectional view of a display panel with reference to a single sub-pixel according to an embodiment.

FIG. 4 is a cross-sectional view of a display panel according to an embodiment, FIG. 5 illustrates mechanical characteristics of the display panel shown in FIG. 4 according to an embodiment, FIG. 6 is a plane view of a display panel according to an embodiment, and FIG. 7 is a cross-sectional view of a display panel with reference to a single sub-pixel according to an embodiment.

As illustrated in FIG. 4, the display panel 150 includes a first substrate 150a, a display region AA, a protective layer 165, and a second substrate 150b. The first substrate 150a and the second substrate 150b may be formed of a plastic material selected from polyimide (PI), polyethersulfone (PES), polyethylene terephthalate (PET), polycarbonates (PC), polyethylene naphthalate (PEN), and acrylonitrile butadiene styrene (ABS).

The display region AA is formed between the first substrate 150a and the second substrate 150b. On the display region AA, various signal and power lines are formed. In some embodiments, sub-pixels and various signal and power lines are formed on the display region AA by a thin film process.

The first substrate 150a and the second substrate 150b are bonded and sealed together by an adhesive member (e.g., the protective layer 165) disposed therebetween. The adhesive member may be selected between a Pressure Sensitive Adhesive (PSA) film and an Optical Clear Adhesive (OCA) film.

The sub-pixels and various signal and power lines formed on the display region AA are susceptible to moisture (humidity) or oxygen. For this reason, the display region AA is protected by the protective layer 165. The protective layer 165 may include a single layer or multiple layers, and may include organic layers and/or inorganic layers being deposited alternatively. Depending on an interlayer of the protective layer 165, the second substrate 150b may be omitted in some embodiments.

An organic light emitting display device manufactured based on the display panel 150 may be implemented as a top-emission type, a bottom-emission type, or a dual-emission type.

As illustrated in FIG. 5, the aforementioned display panel 150 may be flexible. Thus, the organic light emitting display device manufactured based on the flexible display panel 150 may be implemented in various forms, for example, in which a display device is artificially or mechanically bent or has a curved surface.

As illustrated in FIG. 6, the display panel includes a first substrate 150a, a display region AA, a pad portion 160, a first and second gate driver 140a and 140b, a high-potential power line VDD, a low-potential power line VGND, and a reference line VREF.

The pad portion 160 is formed on the upper outer area of the first substrate 150a. The pad portion 160 is a pad area electrically connected to an external circuit board. The pad portion 160 may be, for example, connected to a data circuit board having a data driver 130 mounted thereon or to a control circuit board having a timing controller mounted thereon.

The first and second gate drivers 140a and 140b are circuits for outputting a gate signal to sub-pixels SP formed on the display region AA. In the embodiment shown in FIG. 6, the first gate driver 140a supplies a gate signal from the left side of the display region AA, and the second gate driver 140b supplies a gate signal from the right side of the display region AA.

The high-potential power line VDD supplies high-potential power, which is supplied from outside the display panel 150 (for example, from a power supplier) via the pad portion 160, to the sub-pixels formed on the display region AA. The low-potential power line VGND is a line for supplying low-potential power (or ground power), which is supplied from outside the display panel 150 (for example, from a power supplier) via the pad portion 160, to sub-pixels SP formed on the display region AA. The reference line VREF is a line for supplying initialization power (or a sensing voltage), which is supplied from outside the display panel 150 (for example, from a data driver 130) via the pad portion 160, to sub-pixels formed on the display region AA. In addition or alternatively, the reference line VREF may be a line for transferring a sensing result to the data driver 130. The power-potential power line VDD, the low-potential power line VGND, and the reference line VREF are not limited to the structure of arrangement shown in FIG. 6, but may be arranged with different locations and numbers in other embodiments.

As illustrated in FIG. 7, the first substrate 150a includes a first layer GLS, a second layer SAC, and a third layer PI. In an embodiment, the first layer GLS may be formed of a transparent glass, the second layer SAC may be formed of a-Si:H or SiNz, and the third layer PI may be formed of polyimide, but embodiments of the present invention are not limited thereto. The first layer GLS or a sacrificial layer may be removed after a thin film process during manufacturing of the display panel 150.

A buffer layer BUF is disposed on the first layer 150a. The buffer layer BUF may be a single layer of SiNz or SiOx, or may be multi-layers of SiNx and SiOx.

Semiconductor layers ACT1 and ACT2 are disposed on the buffer layer BUF. The first and second semiconductor layers ACT1 and ACT2 are separated by a patterning process. In an embodiment, the first semiconductor layer ACT1 becomes a semiconductor region (including a source region, a channel region, and a drain region) of the driving transistor DR, and the second semiconductor layer ACT2 becomes a lower electrode of the capacitor Cst.

A first insulation layer 151 is disposed on the semiconductor layers ACT1 and ACT2. The first insulation layer 151 may be a single layer of SiNx or SiOx, or may be multi-layers of SiNx and SiOx.

Gate metal layers 153a and 153b are disposed on the first insulation layer 151. The first and second gate metal layers 153a and 153b are separated by the patterning process (e.g., used to separate the first and second semiconductor layers ACT1 and ACT2). In an embodiment, the first gate metal layer 153a is disposed to correspond to the first semiconductor layer ACT1. The second gate metal layer 152b is disposed to correspond to the second semiconductor layer ACT2. The second gate metal layer 153b becomes a middle electrode of the capacitor Cst.

A second insulation layer 154 is disposed on the gate metal layers 153a and 153b. The second insulation layer 154 may be a single layer of SiNx or SiOx, or may be multi-layers of SiNx and SiOx.

Data metal layers 155a and 155b are disposed on the second insulation layer 154. In an embodiment, the first and second data metal layers 155a and 155b are separated by the patterning process. The first data metal layer 155a is connected to a drain region of the first semiconductor layer ACT1 through contact holes of the insulation layers 151 and 154. The first data metal layer 155a becomes a drain electrode of the driving transistor DR. The second data metal layer 155b is connected to a source region of the first semiconductor layer ACT1 via contact holes of the insulation layers 151 and 154. The second data metal layer 155b becomes a source electrode of the driving transistor DR.

A third insulation layer 156 (also referred to herein as a lower layer 156) is disposed on the data metal layers 155a and 155b. The third insulation layer 156 may be formed of an organic material that makes the surface flat, e.g., an upper surface of the third insulation layer 156 is flat. The third insulation layer 156 may be referred to as a planarization layer. The third insulation layer 156 may be formed of polyacrylate, but it is not limited thereto.

A lower electrode 157 (also referred to herein as a middle layer 157 or middle layers 157) is disposed on the third insulation layer 156. The lower electrode 157 is connected to the first data metal layer 155a, which is the drain electrode of the driving transistor DR, via a contact hole of the third insulation layer 156. The lower electrode 157 becomes an anode electrode of the OLED. The lower electrode 157 may be formed of a transparent electrode material, such as ITO, IXO, or ITZO, but it is not limited thereto.

A bank layer BNK is disposed on the third insulation layer 156. The bank layer BNK is patterned to cover the lower electrode 157 and has an open area that defines an emission area of the OLED.

In some embodiments, a spacer layer SPC is disposed on the bank layer BNK. The spacer layer SPC addresses a problem which occurs during a process of deposition of an upper electrode 159 (also referred to herein as an upper layer 159) and an organic emission layer 158 of the OLED. The space layer SPC may be omitted depending on a manufacturing method.

An organic emission layer 158 is disposed on the lower electrode 157. The organic emission layer 158 may be formed of an organic material that emits red, green, blue, or white light. The organic emission layer 158 may include a Hole Injection Layer (HIL), a Hole Transport Layer (HTL), an Emissive Layer (EML), an Electron Transport Layer (ETL), or an Electron Injection Layer (EIL), and may further include other function layers (an electron trap layer, a buffer layer, etc.).

An upper electrode 159 is disposed on the organic emission layer 158. The upper electrode 159 becomes a cathode electrode of the OLED. The upper electrode 159 may be formed of a non-transparent electrode material, such as AL or Ag, but it is not limited thereto.

The protective layer 165 is disposed on the upper layer 159. In an embodiment, the protective layer 165 includes a first inorganic protective layer 165a, an organic protective layer 165b, and a second inorganic protective layer 165c. The protective layer 165 is not limited thereto, and may further include other types of layers (e.g., an absorption layer, a buffer layer, etc.).

The aforementioned display panel 150 obviates a need of performing a process of forming a protective layer on the data metal layers 155a and 155b of the driving transistor DR (in order to reduce a mask process), and therefore, some steps of the whole process may be omitted, for example, reducing an amount of time or resources required to manufacture the display panel 150.

Hereinafter, a problem that may occur in the aforementioned display panel 150, and embodiments for solving the problem will be described.

Figure 8:
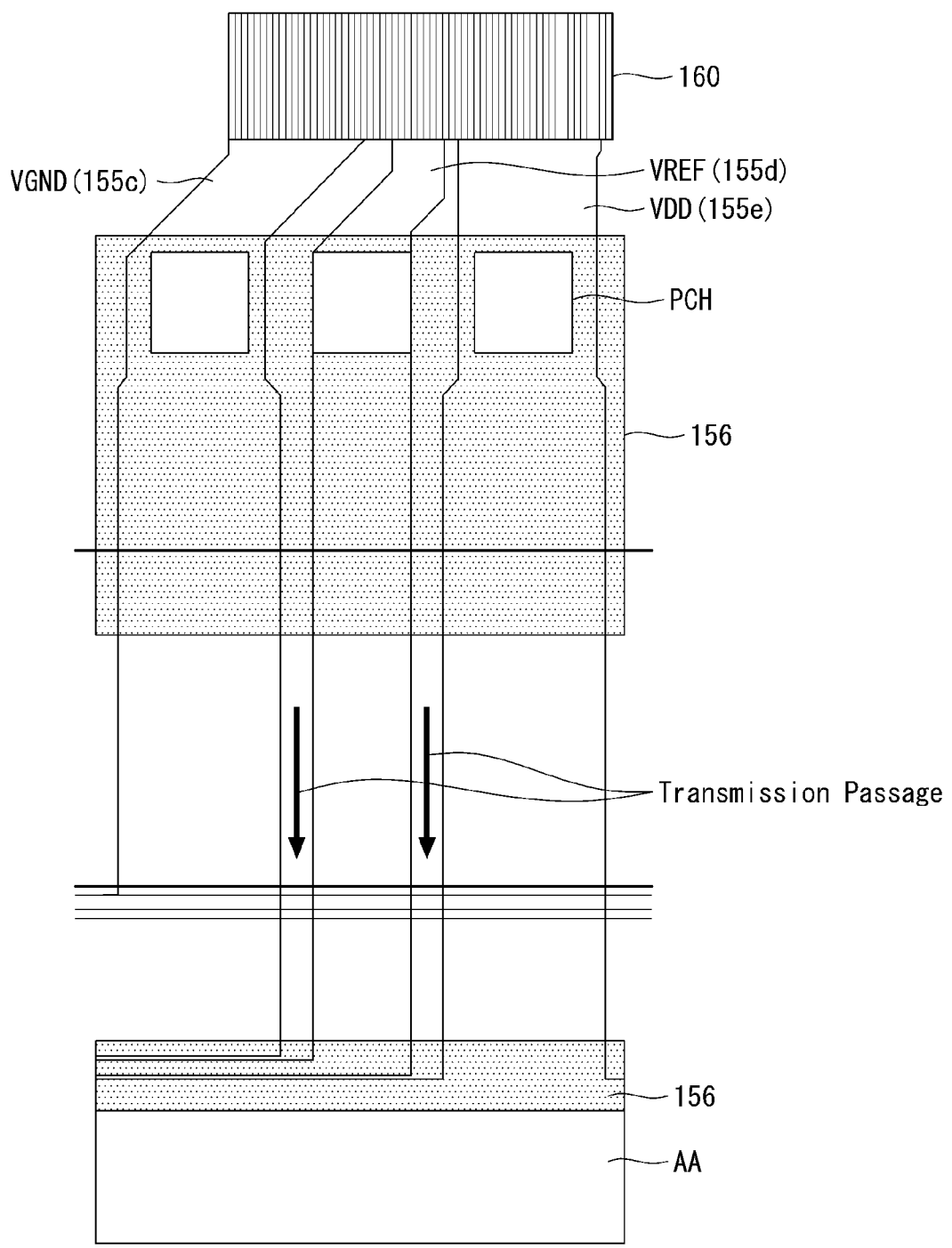
FIG. 8 is a diagram for explanation of a problem occurring in a display panel according to an example.

FIG. 8 is a diagram for explanation of a problem occurring in a display panel according to an example.

As illustrated in FIG. 8, a high-potential power line VDD, a low-potential power line VGND, and a reference line VREF are disposed between a pad portion 160 and a display region AA. The high-potential power line VDD, the low-potential power line VGND, and the reference line VREF are data metal layers 155c, 155d, and 155e, respectively.

In the embodiment shown in FIG. 8, test contact holes PCH are formed on a third insulation layer 156 of the high-potential power line VDD, the low-potential power line VGND, and the reference line VREF, where the third insulation layer 156 is adjacent to the pad portion 160. The test contact holes PCH are holes that expose portions of the high-potential power line VDD, the low-potential power line VGND, and the reference line VREF. However the test contact holes PCH may be omitted in other embodiments.

The high-potential power line VDD, the low-potential power line VGND, the reference line VREF, and the third insulation layer 156 are protected by a protective layer 165, which is formed in a following process. The high-potential power line VDD, the low-potential power line VGND, and the reference line VREF may have sharply sloped edges due to a structural characteristic.

Due to the sharp sloped edges, damage or a crack (e.g., S/D edge damage) may occur, which is a collapse of some sections during a patterning process (e.g., using a developing solution) or an etching process (e.g., using a cleaning solution).

Thus, if moisture transmission occurs in the high-potential power line VDD, the low-potential power line VGND, and/or the reference line VREF through the pad portion 160, moisture or outdoor air spreads from outside of the display panel 150 to the inside along the edges of the power-potential power line VDD, the low-potential power line VGND, and/or the reference line VREF. In some embodiments, when mechanical distortion (e.g., bending of the display panel 150) constantly occurs, moisture transmission may occur because the lines become separated from a substrate. If moisture transmission occurs, it may reduce the lifespan of the display panel 150 and cause image quality degradation, such as a dark spot, and therefore, it is desirable to solve these problems.

In an example, in order to solve the moisture transmission, a third insulation layer 156 corresponding to a planarization layer is formed to cover the high-potential power line VDD, the low-potential power line VGND, and the reference line VREF.

However, forming the third insulation layer 156 by itself may not necessarily be enough to mitigate or eliminate the moisture transmission problem in which moisture constantly spreads along edges of the high-potential power line VDD, the low-potential power line VGND, and/or the reference line VREF. It is because a void or passage is formed between an insulation layer and a metal layer due to a damage which is, for example, a collapse of an edge section of the lines.

In another example, in order to solve the moisture transmission problem, a third insulation layer 156 corresponding to a planarization layer is formed only in certain portions (e.g., some sections) of the high-potential power line VDD, the low-potential power line VGND, and the reference line VREF, where the portions include a portion for the pad portion 160 and another portion adjacent to the display area AA.

However, in some embodiments, forming the third insulation layer 156 in certain portions may not necessarily be enough to mitigate or eliminate the moisture transmission problem in which moisture spreads along edges of the high-potential power line VDD, the low-potential power line VGND, or the reference line VREF. Forming the third insulation layer 156 in certain portions may be helpful to prevent a void or passage from occurring between an insulation layer and a metal layer, but does not necessarily delay incoming moisture or outdoor air caused by the moisture transmission.

Figure 9:
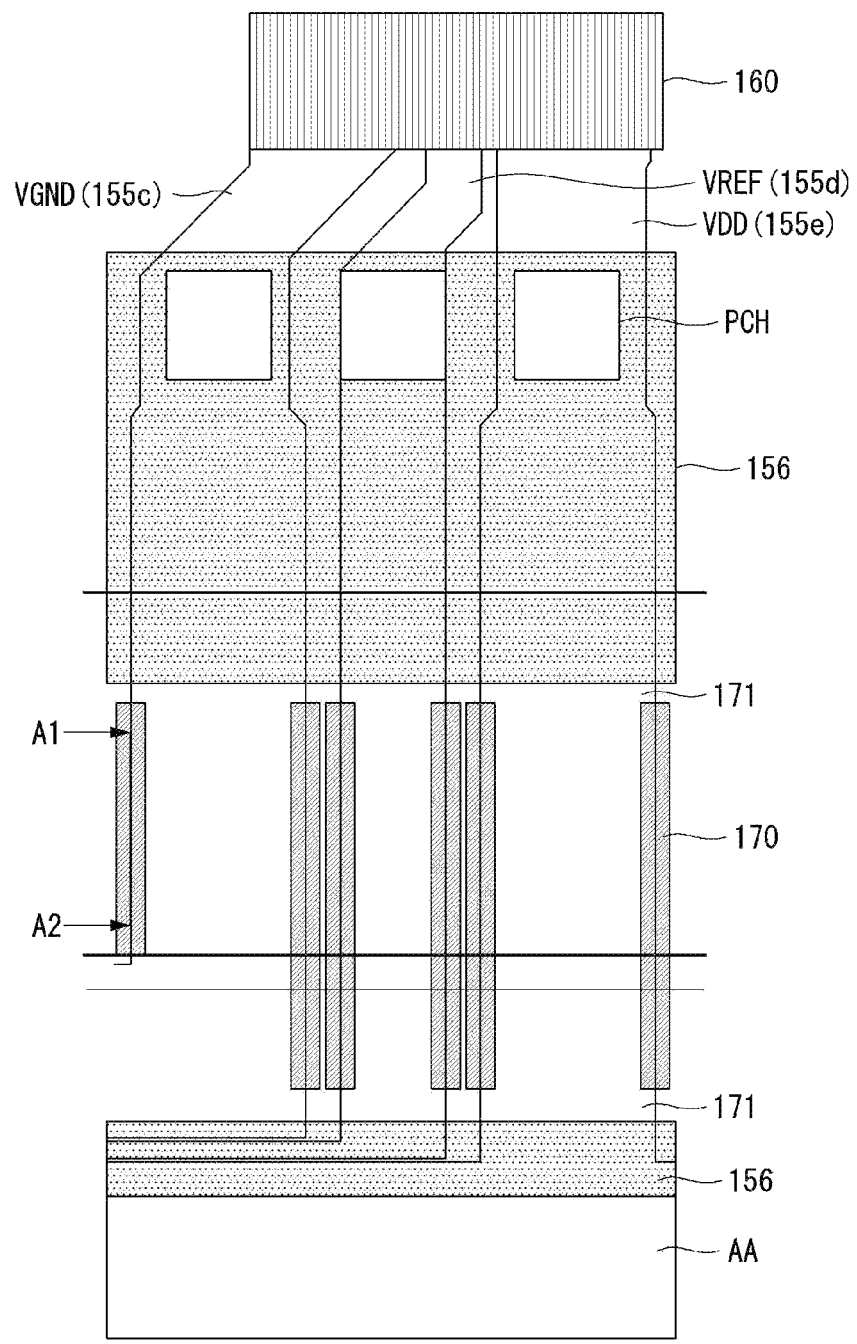
FIG. 9 is a plane view showing a part of a display panel according to an embodiment.
Figure 10:
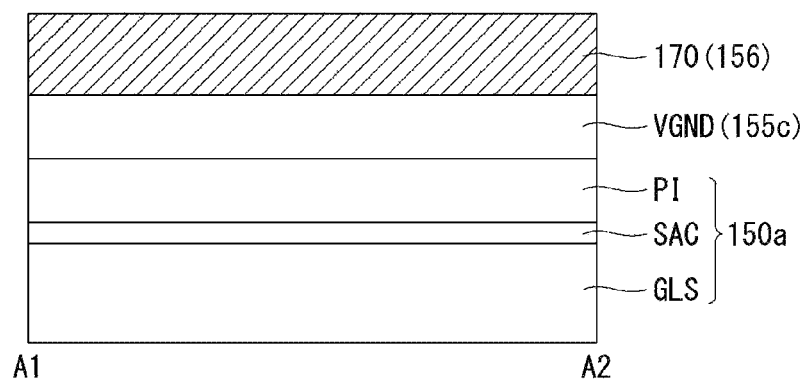
FIG. 10 is a cross-sectional view of a portion A1-A2 shown in FIG. 9 according to an embodiment.
Figure 11:
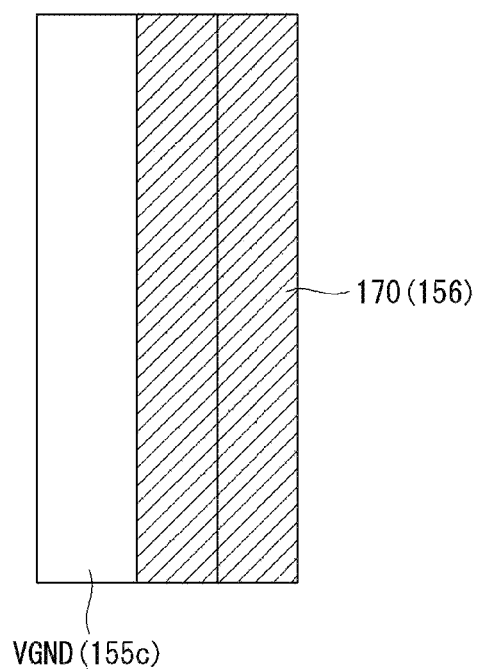
FIG. 11 is a plane view of the portion A1-A2 shown in FIG. 10 according to an embodiment.

FIG. 9 is a plane view showing a part of a display panel according to an embodiment, FIG. 10 is a cross-sectional view of a portion A1-A2 shown in FIG. 9 according to an embodiment, and FIG. 11 is a plane view of the portion A1-A2 shown in FIG. 10 according to an embodiment.

As illustrated in FIGS. 9 to 11, a high-potential power line VDD, a low-potential power line VGND, and a reference line VREF are disposed between a pad portion 160 and a display region AA. The high-potential power line VDD, the low-potential power line VGND, and the reference line VREF are data metal layers 155c, 155d, and 155e, respectively.

In some embodiment test contact holes PCH are formed on a third insulation layer 156 of the high-potential power line VDD, the low-potential power line VGND, and the reference line VREF, where the third insulation layer 156 is adjacent to the pad portion 160. The test contact holes PCH are holes that expose portions of the high-potential power line VDD, the low-potential power line VGND, and/or the reference line VREF. However, the text contact holes PCH may be omitted in other embodiments.

The high-potential power line VDD, the low-potential power line VGND, the reference line VREF, and the third insulation layer 156 are protected by a protective layer 165, which is formed in a following process. The high-potential power line VDD, the low-potential power line VGND, and the reference line VREF may have sharply sloped edges due to a structural characteristic.

In one embodiment, a moisture-transmission delay layer 170 is formed on exposed edges of the high-potential power line VDD, the low-potential power line VGND, and the reference line VREF in order to prevent moisture transmission, where the exposed edges are not covered by the third insulation layer 156. The moisture-transmission delay layer 170 is formed to cover not just the exposed edges of the high-potential power line VDD, the low-potential power line VGND, and the reference line VREF, but also a portion of a third layer PI of a first substrate 150a. Thus, the moisture-transmission delay layer 170 are hung on the edges. In some embodiments, the moisture-transmission delay layer 170 is in the form of a bar that is long-patterned along both exposed edges of the high-potential power line VDD, the low-potential power line VGND, or the reference line VREF.

The moisture-transmission delay layer 170 may be formed of the same material of the third insulation layer 156. Even though the moisture-transmission delay layer 170 may be formed of the same material of the third insulation layer 156, the moisture-transmission delay layer 170 is separated or spaced apart from portions of the third insulation layer 156 covering the pad portion 160 the display region AA. As a result, a delay space 171 in which an insulation layer does not exist is formed between the moisture-transmission delay layer 170 and the third insulation layer 156 covering the pad portion 160. In addition, a delay space 171 in which an insulation layer does not exist is formed between the moisture-transmission delay layer 170 and the third insulation layer 156 covering the display region AA.

The delay space 171 between the moisture-transmission delay layer 170 and the third insulation layer 156 delays incoming moisture and outdoor air. For example, transmission of moisture is delayed until the moisture fills the delay space 171, which is provided by the moisture-transmission delay layer 170 and the third insulation layer 156 covering the pad portion 160. In an embodiment, transmitted moisture can move inside of the moisture-transmission delay layer 170 only when the moisture fills up the delay space 171 provided between the moisture-transmission delay layer 170 and the third insulation layer 156. That is, the moisture-transmission delay layer 170 and the delay space 171 in the surroundings thereof provide a structure for delaying transmission of moisture.

Embodiments including the moisture-transmission delay layer 170 and the delay space 171 have an excellent moisture-transmission delay rate (a moisture-transmission delay time) compared to the examples described above. The moisture-transmission delay rate indicates a period of time during which moisture or outdoor air incoming to the high-potential power line VDD, the low-potential power line VGND, or the reference line VREF through the pad portion 160 is delayed from being spread from outside the display panel 150 to the inside along edges of the high-potential power line VDD, the low-potential power line VGND, or the reference line VREF. In addition, when the protective layer 165 is formed, step coverage improves due to the presence of the moisture-transmission delay layer 170, and thus, embodiments of the display panel 150 have an advantage in blocking a moisture transmission passage toward the protective layer 165.

Figure 12:
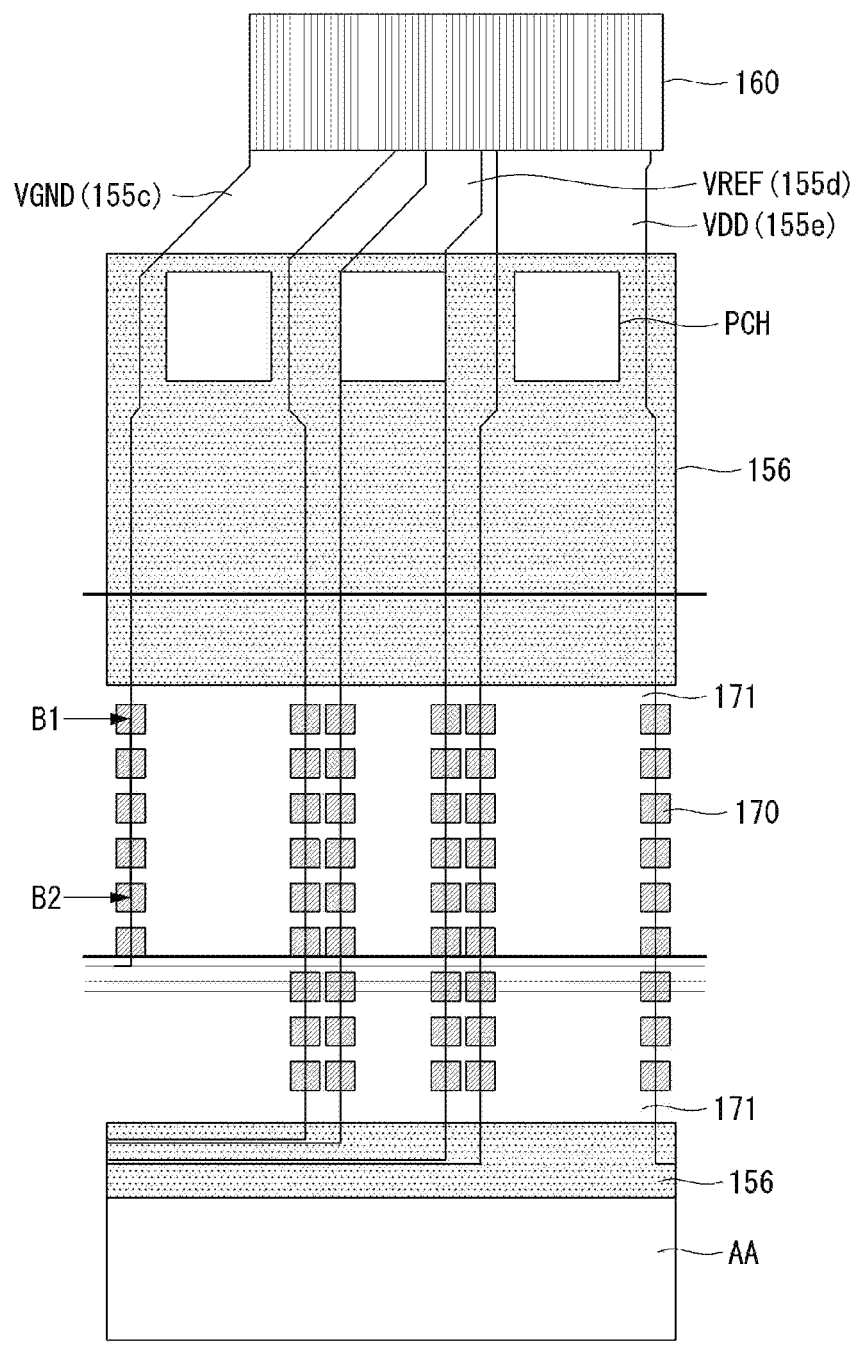
FIG. 12 is a plane view of a portion of a display panel according to an embodiment.
Figure 13:
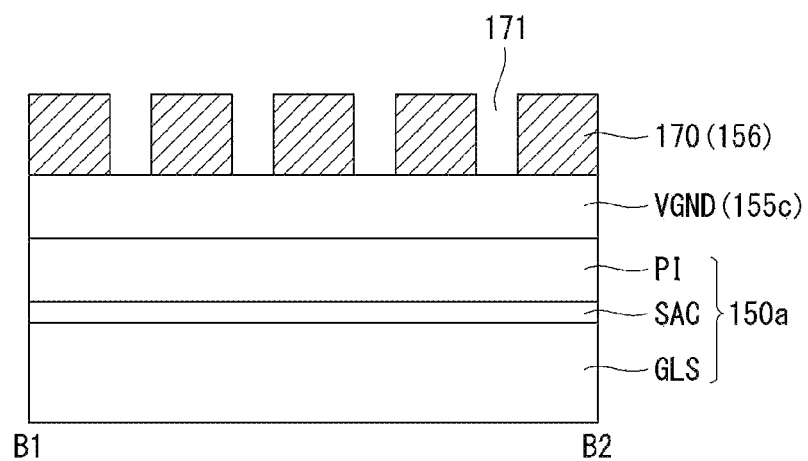
FIG. 13 is a cross-sectional view of a portion B1-B2 shown in FIG. 12 according to an embodiment.
Figure 14:
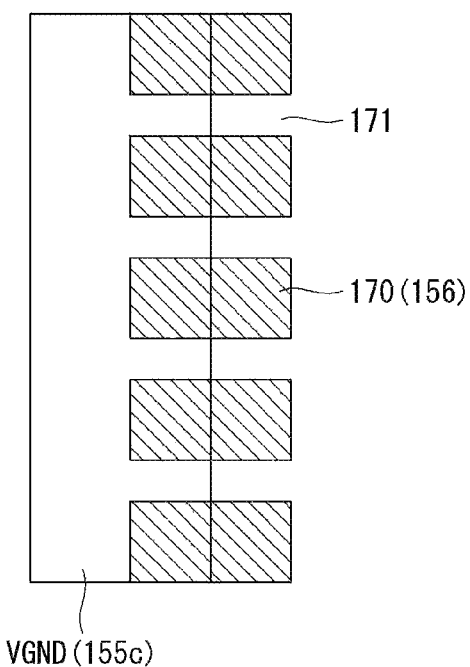
FIG. 14 is a plane view of the portion B1-B2 shown in FIG. 13 according to an embodiment.

FIG. 12 is a plane view of a portion of a display panel 150 according to an embodiment, FIG. 13 is a cross-sectional view of a portion B1-B2 shown in FIG. 12 according to an embodiment, and FIG. 14 is a plane view of the portion B1-B2 shown in FIG. 13 according to an embodiment.

As illustrated in FIGS. 12 and 14, a high-potential power line VDD, a low-potential power line VGND, and a reference line VREF are disposed between a pad portion 160 and a display region AA. The high-potential power line VDD, the low-potential power line VGND, and the reference line VREF are data metal layers 155c, 155d, and 155e, respectively.

In some embodiments, test contact holes PCH are formed on a third insulation layer 156 of the high-potential power line VDD, the low-potential power line VGND, and the reference line VREF, where the third insulation layer 156 is adjacent to the pad portion 160. The test contact holes PCH are holes that expose portions of the high-potential power line VDD, the low-potential power line VGND, and the reference line VREF. However, the text contact holes PCH may be omitted in other embodiments.

The high-potential power line VDD, the low-potential power line VGND, the reference line VREF, and the third insulation layer 156 are protected by a protective layer 165, which is formed in a following process. The high-potential power line VDD, the low-potential power line VGND, and the reference line VREF may have sharply sloped edges due to a structural characteristic.

In one embodiment, a moisture-transmission delay layer 170 is formed on exposed edges of the high-potential power line VDD, the low-potential power line VGND, and the reference line VREF in order to prevent moisture transmission, where the exposed edges are not covered by the third insulation layer 156. The moisture-transmission delay layer 170 is formed to cover not just the exposed edges of the high-potential power line VDD, the low-potential power line VGND, and the reference line VREF, but also a portion of a third layer PI of a first substrate 150a. Thus, the moisture-transmission delay layer 170 is hung on the edges. The moisture-transmission delay layer 170 may be in the form of multiple islands that are patterned along both exposed edges of the high-potential power line VDD, the low-potential power line VGND, or the reference line VREF.

The moisture-transmission delay layer 170 may be formed of the same material of the third insulation layer 156. Even though the moisture-transmission delay layer 170 is formed of the same material of the third insulation layer 156, the moisture-transmission delay layer 170 may be separated or spaced apart from portions of the third insulation layer 156 covering the pad portion 160 and the display region AA. As a result, multiple delay spaces 171 in which an insulation layer does not exist are formed between the moisture-transmission delay layer 170 and the third insulation layer 156 covering the pad portion 160, and between the moisture-transmission delay layer 170 and the third insulation layer 156 covering the display region AA.

The multiple delay spaces 171 between the moisture-transmission delay layer 170 and the third insulation layer 156 delays incoming moisture and outdoor air. For example, transmission of moisture is delayed until the moisture fills the delay spaces 171, which is provided by the moisture-transmission delay layer 170 and the third insulation layer 156 covering the pad portion 160. In an embodiment, transmitted moisture can move inside of a next block of the moisture-transmission delay layer 170 only when the moisture fills up the delay spaces 171 provided between the moisture-transmission delay layer 170 and the third insulation layer 156. That is, the moisture-transmission delay layer 170 and the delay spaces 171 in the surroundings thereof provide a structure for delaying transmission of moisture.

In some embodiments, including additional delay spaces 171 (e.g., as shown in FIG. 12) may improve the moisture-transmission delay rate (a moisture-transmission delay time) compared to embodiments with fewer delay spaces 171 (e.g., as shown in FIG. 9). The moisture-transmission delay rate indicates a period of time during which moisture or outdoor air incoming to the high-potential power line VDD, the low-potential power line VGND, or the reference line VREF through the pad portion 160 is delayed from being spread from outside the display panel 150 to the inside along edges of the high-potential power line VDD, the low-potential power line VGND, or the reference line VREF. In addition, when the protective layer 165 is formed, step coverage improves due to the presence of the moisture-transmission delay layer 170, and thus, embodiments of the display panel 150 have an advantage in blocking a moisture transmission passage toward the protective layer 165.

Figure 15:
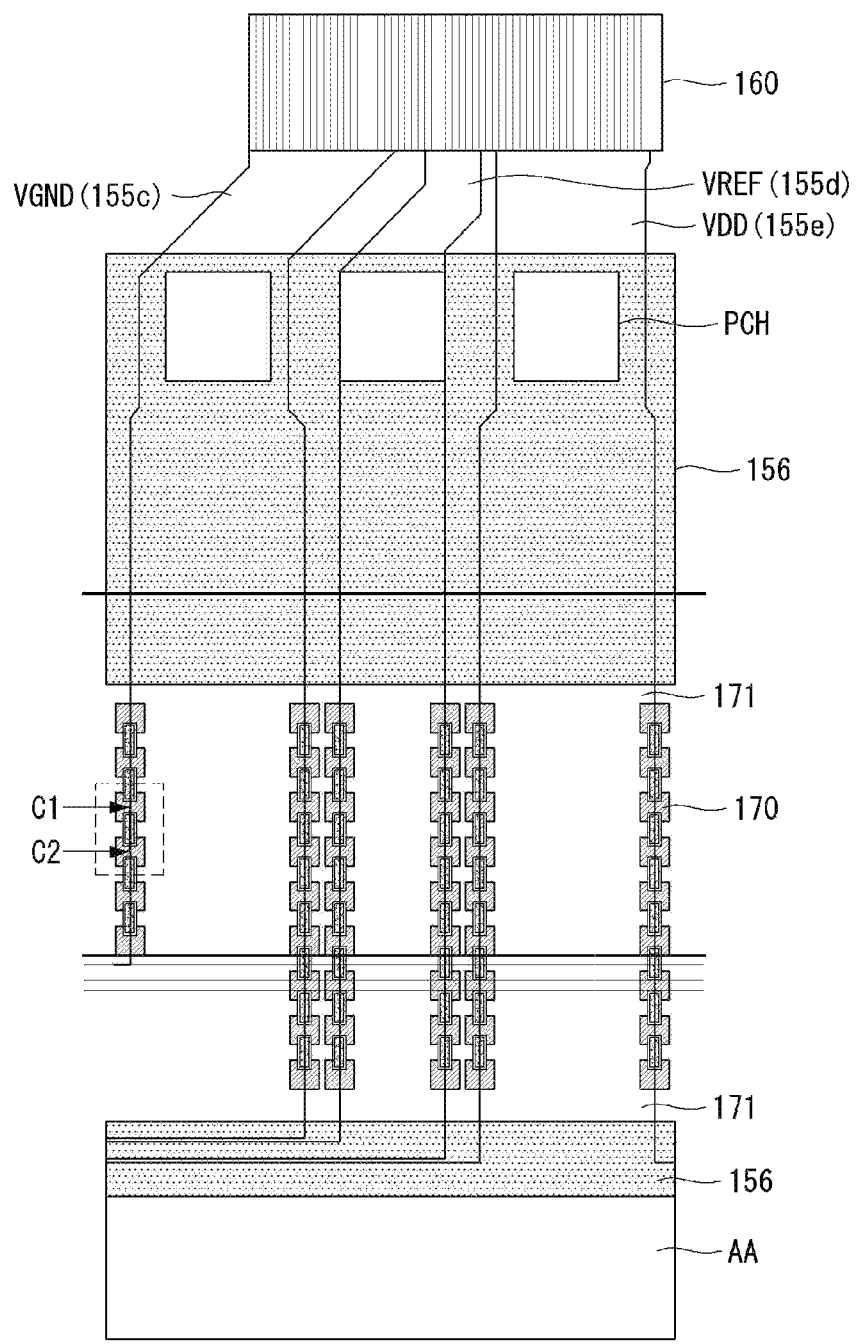
FIG. 15 is a plane view of a portion of a display panel according to an embodiment.
Figure 16:
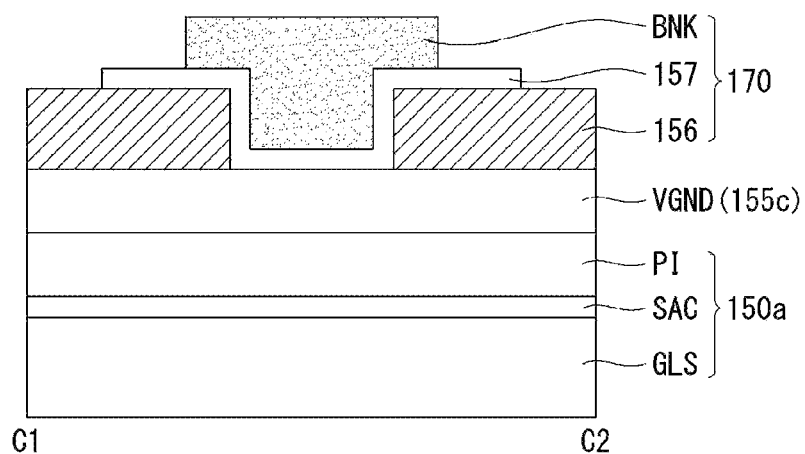
FIG. 16 is a cross-sectional view of a portion C1-C2 shown in FIG. 15 according to an embodiment.
Figure 17:
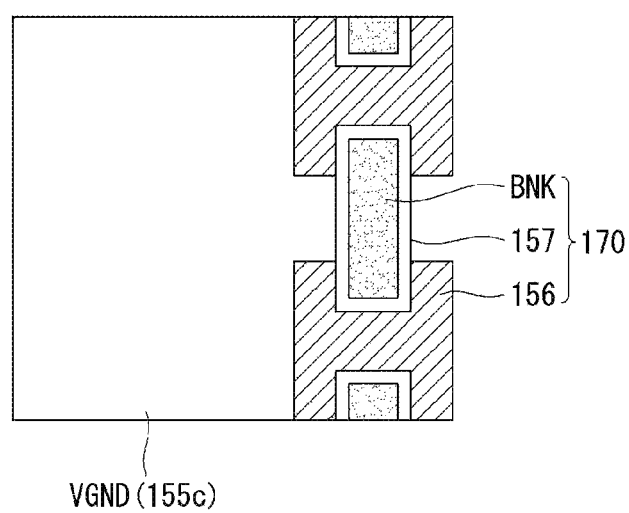
FIG. 17 is a plane view of the portion C1-C2 shown in FIG. 16 according to an embodiment.
Figure 18:
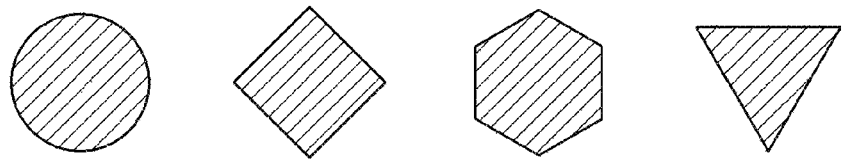
FIG. 18 is a diagram illustrating various forms of a moisture-transmission delay layer according to various embodiments.

FIG. 15 is a plane view of a portion of a display panel according to an embodiment, FIG. 16 is a cross-sectional view of a portion C1-C2 shown in FIG. 15 according to an embodiment, and FIG. 17 is a plane view of the portion C1-C2 shown in FIG. 16 according to an embodiment, and FIG. 18 is a diagram illustrating various forms of a moisture-transmission delay layer according to various embodiments.

As illustrated in FIGS. 15 and 17, a high-potential power line VDD, a low-potential power line VGND, and a reference line VREF are disposed between a pad portion 160 and a display region AA. The high-potential power line VDD, the low-potential power line VGND, and the reference line VREF are data metal layers 155*c*, 155*d*, and 155*e*, respectively.

In some embodiments, test contact holes PCH are formed on a third insulation layer 156 of the high-potential power line VDD, the low-potential power line VGND, and the reference line VREF, where the third insulation layer 156 is adjacent to the pad portion 160. The test contact holes PCH are holes that expose portions of the high-potential power line VDD, the low-potential power line VGND, and the reference line VREF. However, the text contact holes PCH may be omitted in other embodiments.

The high-potential power line VDD, the low-potential power line VGND, the reference line VREF, and the third insulation layer 156 are protected by a protective layer 165, which is formed in a following process. The high-potential power line VDD, the low-potential power line VGND, and the reference line VREF may have sharply sloped edges due to a structural characteristic.

In one embodiment, a moisture-transmission delay layer 170 is formed on exposed edges of the high-potential power line VDD, the low-potential power line VGND, and the reference line VREF in order to prevent moisture transmission, where the exposed edges are not covered by the third insulation layer 156. The moisture-transmission delay layer 170 is formed to cover not just the exposed edges of the high-potential power line VDD, the low-potential power line VGND, and the reference line VREF, but also a portion of a third layer PI of a first substrate 150*a*. Thus, the moisture-transmission delay layer 170 is hung on the edges.

In one embodiment, the moisture-transmission delay layer 170 is in the form of a combination of multiple islands and a bridge connecting the multiple islands, where the multiple islands are patterned along both exposed edges of the high-potential power line VDD, the low-potential power line VGND, or the reference line VREF. Additionally, the moisture-transmission delay layer 170 may include hybrid multi-layers in which an organic material and an inorganic material are combined.

A lower layer 156, which is part of the third insulation layer 156, includes an island in the moisture-transmission delay layer 170 and may be formed of the same material of the third insulation layer 156. Multiple lower layers 156 are arranged in the form of islands. Multiple middle layers 157 are disposed on the lower layers 156. The middle layers 157 may function as bridges, for example, by connecting an island of a lower layer 156 and to another island of a neighboring lower layer 156. The middle layers 157 may be formed of the same material of a lower electrode of an OLED (e.g., lower electrode 157 shown in FIG. 7). Each of the middle layers 157 may have a depression because the middle layer 157 connects a lower layer 156 and its neighboring lower layer 156, e.g., filling in the gap between the two islands of the lower layers 156.

Multiple upper layers BNK are disposed on the middle layers 157. The upper layers BNK cover depressions of the middle layers 157. The upper layers may be formed of the same material of the bank layer BNK. The size ratio (e.g., length or width) between a middle layer 157 and an upper layer BNK may be 1:1 or N:1 (e.g., where N is an integer equal to or greater than 1).

In one embodiment, the middle layers 157 block moisture-transmission passages or delays transmission of moisture into a display panel 150. In some embodiments, the middle layers 157 are desirably larger than the upper layers BNK. However, relative to the upper layers BNK (or the lower layers 156), the middle layers 157 may be more separated or spaced apart from each other to have a space therebetween, and thus, the middle layers 157 may desirably have a smaller size than the upper layers BNK (or the lower layers 156).

The moisture-transmission delay layer 170 is separate or spaced apart from portions of the third insulation layer 156 covering the pad portion 160 and the display region AA. As a result, multiple delay spaces 171 in which an insulation layer does not exist are formed between the moisture-transmission delay layer 170 and the third insulation layer 156, which covers the pad portion 160, and between the moisture-transmission delay layer 170 and the third insulation layer 156 which covers the display region AA.

The multiple delay spaces 171 between the moisture-transmission delay layer 170 and the third insulation layer 156 delays incoming moisture and outdoor air. For example, transmission of moisture is delayed until the moisture fills the delay spaces 171, which is provided by the moisture-transmission delay layer 170 and the third insulation layer 156 covering the pad portion 160. In an embodiment, transmitted moisture can move inside of a next block of the moisture-transmission delay layer 170 only when the moisture fills up the delay spaces 171 provided between the moisture-transmission delay layer 170 and the third insulation layer 156. That is, the moisture-transmission delay layer 170 and the delay spaces 171 in the surroundings thereof provide a structure for delaying transmission of moisture.

In some embodiments, the middle layers 157 corresponding to bridges in the moisture-transmission delay layer 170 cover parts damaged by edges of the high-potential power lines VDD, the low-potential power line VGND, or the reference line VREF. In other words, the middle layers 157 may not only block a void or passage occurring between an insulation layer and a metal layer due to a chemical damage (e.g., the middle layers 157 fills the void or passage), but also block a moisture-transmission passage.

In an embodiment, a display panel 150 having the third insulation layer 156 in a form of islands connected by bridges, for example, as shown in FIG. 15, has an excellent moisture-transmission delay rate (e.g., a moisture-transmission delay time) compared to the embodiments shown in FIGS. 9 and 12. The moisture-transmission delay rate indicates a period of time during which moisture or outdoor air incoming to the high-potential power line VDD, the low-potential power line VGND, or the reference line VREF through the pad portion 160 is delayed from being spread from outside the display panel 150 to the inside along edges of the high-potential power line VDD, the low-potential power line VGND, or the reference line VREF. In addition, when the protective layer 165 is formed, step coverage improves due to the presence of the moisture-transmission delay layer 170, and thus, embodiments of the display panel 150 have an advantage in blocking a transmission passage toward the protective layer 165.

The embodiments shown in FIGS. 12-17 include moisture-transmission delay layers 170 having the form of rectangular islands. However, in other embodiments, the moisture-transmission delay layer 170 may be in another type of form, e.g., a circle, a diamond, or a triangle (as shown in FIG. 18), among other types of suitable forms. In addition, the sizes of the moisture-transmission layer 170 and the delay space 171, or a distance therebetween may be optimized (e.g., increased or decreased) through repeated experiments.

As such, embodiments of the present invention provide an organic light emitting display device that reduces a probability of lines becoming damaged and delays a time for spreading moisture along edges of the lines, so that the lifespan and reliability of a display panel 150 may improve and a probability of image quality degradation may be reduced. In addition, embodiments provide an organic light emitting display that improves step coverage when forming a protective layer 165, which may improve sealing of the protective layer 165.

What is claimed is:

1. An organic light emitting display unit comprising:
   a first substrate;
   a display region having sub-pixels disposed on the first substrate;
   a pad portion disposed on the first substrate and electrically connected to an external device;
   a plurality of lines disposed between the pad portion and the display region, the plurality of lines electrically connected to the external device via the pad portion, and configured to transfer a signal or power to the external device, each of the plurality of lines including a first edge and a second edge in a direction of the plurality of lines; and
   a moisture-transmission delay layer including:
      a lower layer including a plurality of physical lower layer portions separated from each other, wherein the first edge and the second edge of each of the plurality of lines is covered by a different set of two or more physical lower layer portions of the plurality of physical lower layer portions; and
      a middle layer including a plurality of physical middle layer portions separated from each other, each physical middle layer portion of the plurality of physical middle layer portions being disposed on and connecting at least two corresponding physical lower layer portions of the plurality of physical lower layer portions on a same one of the first edge or the second edge of one of the plurality of lines.

2. The organic light emitting display device of claim 1, wherein the moisture-transmission delay layer covers a portion of the first substrate.

3. The organic light emitting display device of claim 1, wherein the moisture-transmission delay layer and a planarization layer disposed on the display region are made of a same material.

4. The organic light emitting display device of claim 1, further comprising:
   a first planarization layer on first portions of the plurality of lines adjacent to the pad portion; and
   a second planarization layer on second portions of the plurality of lines adjacent to the display region,
   wherein the first planarization layer and the second planarization layer are spaced apart from each other.

5. The organic light emitting display device of claim 4, wherein the moisture-transmission delay layer is spaced apart from the first planarization layer and the second planarization layer, so that the moisture-transmission layer has a moisture-transmission delay space that delays transmission of moisture.

6. The organic light emitting display device of claim 1, wherein the moisture-transmission delay layer is a hybrid multi-layer including an organic material and an inorganic material.

7. The organic light emitting display device of claim 1, wherein the moisture-transmission delay layer further comprises:
   an upper layer including a plurality of physical upper layer portions separated from each other, each physical upper layer portion of the plurality of physical upper layer portions disposed on one of the plurality of physical middle layer portions.

8. The organic light emitting display device of claim 7, wherein:
   the lower layer and a planarization layer disposed on the display region are formed of a first material, the middle layer and a lower electrode disposed on the display region are formed of a second material, and the upper layer and a bank layer disposed on the display region are formed of a third material.

9. The organic light emitting display device of claim 1, wherein the plurality of lines comprises:
   a high-potential power line for transferring high-potential power, supplied from the pad portion, to the display region;
   a low-potential power line configured for transferring low-potential power, supplied from the pad portion, to the display region, and
   a reference line for transferring a voltage, supplied from the pad portion, to the display region and transferring a sensing result of the display region to the pad portion.

10. An organic light emitting display device comprising:
    a first substrate;
    a display region having sub-pixels disposed on the first substrate;
    a pad portion disposed on the first substrate and electrically connected to an external device;
    a plurality of lines disposed between the pad portion and the display region, the plurality of lines electrically connected to the external device via the pad portion, and configured to transfer a signal or power to the external device, each of the plurality of lines including a first edge and a second edge in a direction of the plurality of lines;
    an insulation layer covering a portion of the plurality of lines disposed between the pad portion and the display region; and
    a moisture-transmission delay layer including:
      a lower layer including a plurality of physical lower layer portions separated from each other, wherein the first edge and the second edge of each of the plurality of lines not covered by the insulation layer is covered by a different set of two or more physical lower layer portions of the plurality of physical lower layer portions; and
      a middle layer including a plurality of physical middle layer portions separated from each other, each physical middle layer portion of the plurality of physical middle layer portions being disposed on and connecting at least two corresponding physical lower layer portions of the plurality of physical lower layer portions on a same one of the first edge or the second edge of one of the plurality of lines.

11. The organic light emitting display device of claim 10, wherein the insulation layer is formed to cover first portions of the plurality of lines adjacent to the pad portion and second portions of the plurality of lines adjacent to the display region.

12. The organic light emitting display device of claim 10, wherein the moisture-transmission delay layer covers a portion of the first substrate.

13. The organic light emitting display device of claim 10, wherein the moisture-transmission delay layer and a planarization layer disposed on the display layer are made of a same material.

14. The organic light emitting display device of claim 10, wherein the moisture-transmission delay layer further comprises:
    an upper layer including a plurality of physical upper layer portions separated from each other, each physical upper layer portion of the plurality of physical upper layer portions disposed on one of the plurality of physical middle layer portions.

15. The organic light emitting display device of claim 7, wherein one or more of the plurality of physical middle layer portions are disposed in spaces separating the plurality of physical lower layer portions.

16. The organic light emitting display device of claim 7, wherein one or more of the plurality of physical upper layer portions are disposed in spaces separating the plurality of physical lower layer portions.

17. The organic light emitting display device of claim 7, wherein the plurality of physical middle layer portions each have a first width greater than a second width of each of the plurality of physical upper layer portions.

18. The organic light emitting display device of claim 17, wherein the plurality of physical middle layer portions each have a first length greater than a second length of each of the plurality of physical upper layer portions.

19. An organic light emitting display unit comprising:
    a first substrate;
    a display region having sub-pixels disposed on the first substrate;
    a pad portion disposed on the first substrate and electrically connected to an external device;
    a plurality of lines disposed between the pad portion and the display region, the plurality of lines electrically connected to the external device via the pad portion, and configured to transfer a signal or power to the external device, each of the plurality of lines including a first edge and a second edge in a direction of the plurality of lines; and
    a moisture-transmission delay layer including:
      a lower layer including a plurality of physical lower layer portions separated from each other, wherein the first edge and the second edge of each of the plurality of lines is covered by a different set of two or more physical lower layer portions of the plurality of physical lower layer portions; and
      a middle layer including a plurality of physical middle layer portions separated from each other, each physical middle layer portion of the plurality of physical middle layer portions being disposed on and connecting at least two corresponding physical lower layer portions of the plurality of physical lower layer portions on a same one of the first edge or the second edge of one of the plurality of lines, wherein the plurality of physical lower layer portions each have a first width greater than a second width of each of the plurality of physical middle layer portions.

* * * * *